United States Patent
Rohleder et al.

(10) Patent No.: US 6,870,787 B2
(45) Date of Patent: Mar. 22, 2005

(54) CONFIGURATION AND METHOD FOR CHECKING AN ADDRESS GENERATOR

(75) Inventors: Markus Rohleder, München (DE); Jörg Weller, München (DE); Peter Mayer, Neubiberg (DE); Matthias Grewe, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/620,587

(22) Filed: Jul. 16, 2003

(65) Prior Publication Data

US 2004/0080994 A1 Apr. 29, 2004

(30) Foreign Application Priority Data

Jul. 16, 2002 (DE) .......................... 102 32 178

(51) Int. Cl.[7] ................................. G11C 8/00
(52) U.S. Cl. ................. 365/230.01; 365/230.06
(58) Field of Search ....................... 365/230.01, 230.06, 365/201, 230.08

(56) References Cited

U.S. PATENT DOCUMENTS

| 4,742,490 A | | 5/1988 | Hoffmann | |
|---|---|---|---|---|
| 5,301,156 A | | 4/1994 | Talley | |
| 5,982,696 A | * | 11/1999 | Rao | 365/230.03 |
| 6,205,081 B1 | * | 3/2001 | Lee | 365/230.08 |
| 6,356,504 B1 | * | 3/2002 | Kim | 365/230.06 |
| 6,400,636 B1 | * | 6/2002 | Kim et al. | 365/230.06 |
| 6,414,901 B1 | * | 7/2002 | Shin | 365/230.08 |

FOREIGN PATENT DOCUMENTS

EP  0 186 040 A1  7/1986

* cited by examiner

Primary Examiner—Anh Phung
(74) Attorney, Agent, or Firm—Laurence A. Greenberg; Werner H. Stemer; Ralph E. Locher

(57) ABSTRACT

In a configuration for checking an address generator, a memory apparatus is configured such that it can store values of address signals that are present on lines of an address bus. The stored values can then be output to at least one access point where the values are provided for further evaluation.

5 Claims, 3 Drawing Sheets

US 6,870,787 B2

CONFIGURATION AND METHOD FOR CHECKING AN ADDRESS GENERATOR

BACKGROUND OF THE INVENTION

Field of the Invention

The present invention relates to a configuration and method for checking an address generator. The address generator is part of a test apparatus that is in turn part of an integrated circuit. The test apparatus has a set of first switching devices and a set of second switching devices. The address generator has a given number of address outputs which can be connected through the set of first switching devices to lines of an address bus in the integrated circuit in order to output first address values, generated in the address generator, onto the address bus of the integrated circuit. The test apparatus has a memory apparatus with memory elements whose number is equal to the given number of address outputs of the address generator. The memory apparatus can be supplied with an external address signal in order to store second address values, and the second address values stored in the memory apparatus can be output from the memory elements in the memory apparatus onto the lines of the address bus in the integrated circuit through the set of second switching devices.

The operation of integrated circuits is known to need testing both during the development phase and during and after the manufacturing process. Such function tests can, depending on the type of integrated circuit to be tested, require a very long period of time to perform them. A long period of time slows down the number of circuits which can be tested per unit time, however, which then affects the productivity of the manufacturing process and results in higher costs. It is possible to increase the number of circuits that can be tested per unit time by increasing the number of test machines used for performing the tests. However, this also increases the costs in the form of higher (overall) purchase costs for the test machines.

Against this background, however, some types of integrated circuits are configured such that (at least in theory) parts of them can be tested in parallel with one another at the same time, although no provision at all (or at least not in this scope) is made for such contemporaneous parallel operation for these circuits in normal mode. Such circuits are, in particular, microprocessors (or at least subdivisions of microprocessors), semiconductor memories and circuits with integrated memory arrays ("embedded DRAMs"). Particularly in the field of integrated semiconductor memories, consideration was given even many years ago to how their test time could be reduced without any loss of test depth. By way of example, Published, European Patent Application EP 0 186 040 A1, corresponding to U.S. Pat. No. 4,742,490, proposed almost 20 years ago, testing the operation of integrated semiconductor memories in a manner such that a special test mode is used to test memory cells disposed in different memory cell arrays at the same time and in parallel with one another. Since then, the nature of these "parallel tests" has been continually refined.

Today, there are integrated semiconductor memories of the DRAM type, for example, in which values of address signals which would actually need to be applied to the semiconductor memory from the outside (normal mode) are generated internally in the chip by a dedicated address generator, whose operation may even be programmable, and the values are then applied to the lines of address buses. However, this disadvantageously results in that, before such an address generator is used for the purpose of testing the semiconductor memory, the address generator itself should first be checked for correct operation. In this case, new problems arise, however: minute needle tips, "picoprobes", would need to be used to ascertain the profile of the address signals which are on the lines in the address bus. This ranges from very difficult to impossible, however: first, the narrowness of the lines results in that there is a problem in fitting such needle tips precisely on the interconnects. Second, the interconnects are often totally inaccessible, at least without special analytical processes such as etching away layers etc., which then also in turn results in that the semiconductor memory is destroyed, because the interconnects are situated beneath a passivation layer or even beneath a number of other wiring planes. The latter is so particularly in the case of such integrated circuits as have "embedded memory" regions. These are known to be circuits which perform any, usually digital, functions and which, in order to perform these functions, need to revert to values that are stored "anywhere" (one example which may be used for such stored information is "ignition under the control of characteristic maps" in electronic ignitions in motor vehicles, implemented using integrated circuits). This "anywhere" is today frequently implemented on the same integrated circuit as the actual circuit itself, namely in a dedicated memory area.

SUMMARY OF THE INVENTION

It is accordingly an object of the invention to provide a configuration and a method for checking an address generator that overcome the above-mentioned disadvantages of the prior art devices and methods of this general type.

With the foregoing and other objects in view there is provided, in accordance with the invention, a configuration for checking an address generator of a test apparatus of an integrated circuit. The configuration contains an address bus having lines, and a set of first switching devices connected to the lines and to the address generator. The address generator has a given number of address outputs connected by the set of first switching devices to the lines of the address bus for outputting first address values, generated in the address generator, onto the address bus. A set of second switching devices is connected to the lines. At least one access point is provided. A memory apparatus with a plurality of memory elements equal to the given number of address outputs of the address generator is connected to the set of second switching devices. The memory apparatus receives an external address signal for storing second address values, and the second address values stored in the memory apparatus are output from the memory elements of the memory apparatus onto the lines of the address bus through the set of second switching devices. The memory apparatus stores values of address signals present on the lines of the address bus. The memory apparatus is connected to the access point and the values stored being output by the memory apparatus to the access point.

In accordance with an added feature of the invention, a control device is provided for controlling storage of the values of the address signals present on the lines of the address bus into the memory apparatus.

In accordance with an additional feature of the invention, at least one third switching device is connected between the memory apparatus and the access point for outputting the values of the address signals stored in the memory apparatus to the access point.

In accordance with a further feature of the invention, the values stored in the memory apparatus are output serially to the access point. Alternatively, the access point is one of a plurality of access points coupled to the memory apparatus, and the values stored in the memory apparatus are output in parallel to the access points.

With the foregoing and other objects in view there is further provided, in accordance with the invention, a method for checking an address generator of a test apparatus of an integrated semiconductor circuit. The method includes generating address signals in the address generator, outputting the address signals output onto lines of an address bus, transferring the address signals present on the lines of the address bus to a memory apparatus, and forwarding the address signals from the memory apparatus to at least one access point.

In accordance with an added mode of the invention, there is the step of outputting serially the address signals to the access point.

In accordance with an additional mode of the invention, there is the step of outputting in parallel the address signals to a plurality of access points.

In accordance with an added mode of the invention, there is the step of carrying out the checking during a special test mode of the integrated semiconductor circuit.

With the foregoing and other objects in view there is additionally provided, in accordance with the invention, a method for checking an address generator of a test apparatus of an integrated circuit. The methods includes generating address signals in the address generator, outputting the address signals through a set of first switching devices onto lines of an address bus, transferring the address signals present on the lines of the address bus through a set of second switching devices to a memory apparatus being part of the test apparatus, and outputting the address signals from the memory apparatus to at least one access point.

Other features which are considered as characteristic for the invention are set forth in the appended claims.

Although the invention is illustrated and described herein as embodied in a configuration and a method for checking an address generator, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
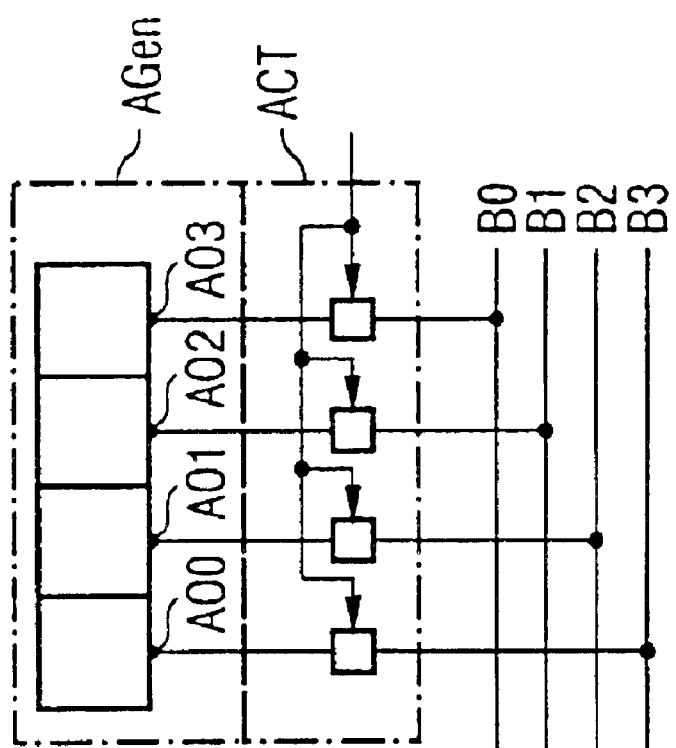
FIG. 1 is block circuit diagram of a detail from a known semiconductor memory.
Figure 1:
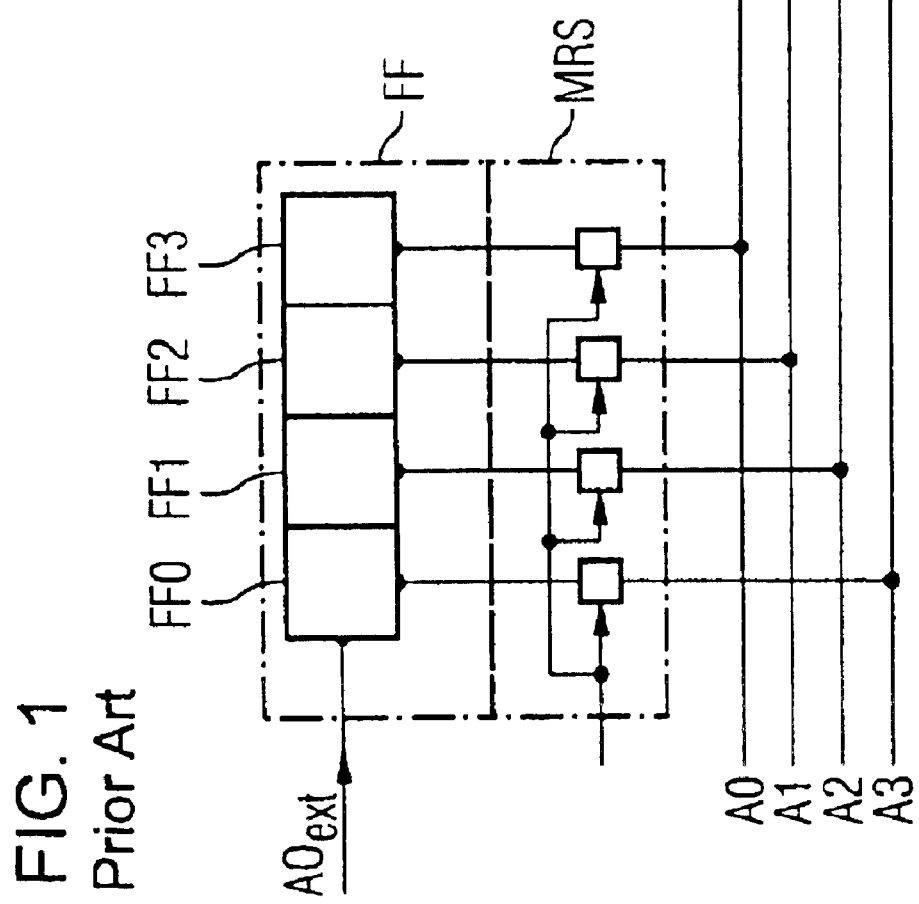

Referring now to the figures of the drawing in detail and first, particularly, to FIG. 1 thereof, there is shown a known semiconductor memory which has, like any semiconductor memory, an address bus A0 to A3, implemented in the form of (in this case four) address bus lines B0 to B3. In addition, there is an address generator AGen having address outputs A00 to A03. A number n of the address outputs A00 to A03 is equal to a number of the address bus lines B0 to B03, that is to say four in this case. The address outputs A00 to A03 can be connected to the address bus lines B0 to B3 through a set of first switching devices ACT. It is thus possible to supply the address bus A0 to A3 with address signals generated by the address generator AGen. The first switching devices ACT are actuated by a control signal (not denoted in more detail). FIG. 1 also shows a memory apparatus FF with memory elements FF0 to FF3. The number of memory elements FF0 to FF3 is also equal to the number n of address bus lines B0 to B3, that is to say equal to four in the present case. Using an external address signal $A0_{ext}$, which is clocked serially, the memory elements FF0 to FF3 can store an address value (to this end, the memory apparatus FF is advantageously in the form of a shift register with flip-flops) which can then be sent to the address bus lines B0 to B3 through a set of second switching devices MRS. This can be used, by way of example, to put the memory into a particular configuration state.

The configuration can be used to test the operation of an integrated semiconductor memory or else of the memory area ("embedded DRAM") in another integrated circuit. However, there is no certainty in this case that the address generator AGen, which generates the address signals for the addresses of the memory cells which are to be actuated in such a test, is actually operating correctly. By way of example, it could be that the address generator AGen does not generate all of the address signals required for addressing. This would remain unnoticed, with the result that not all of the memory cells would be tested, which is incorrect.

Figure 2:
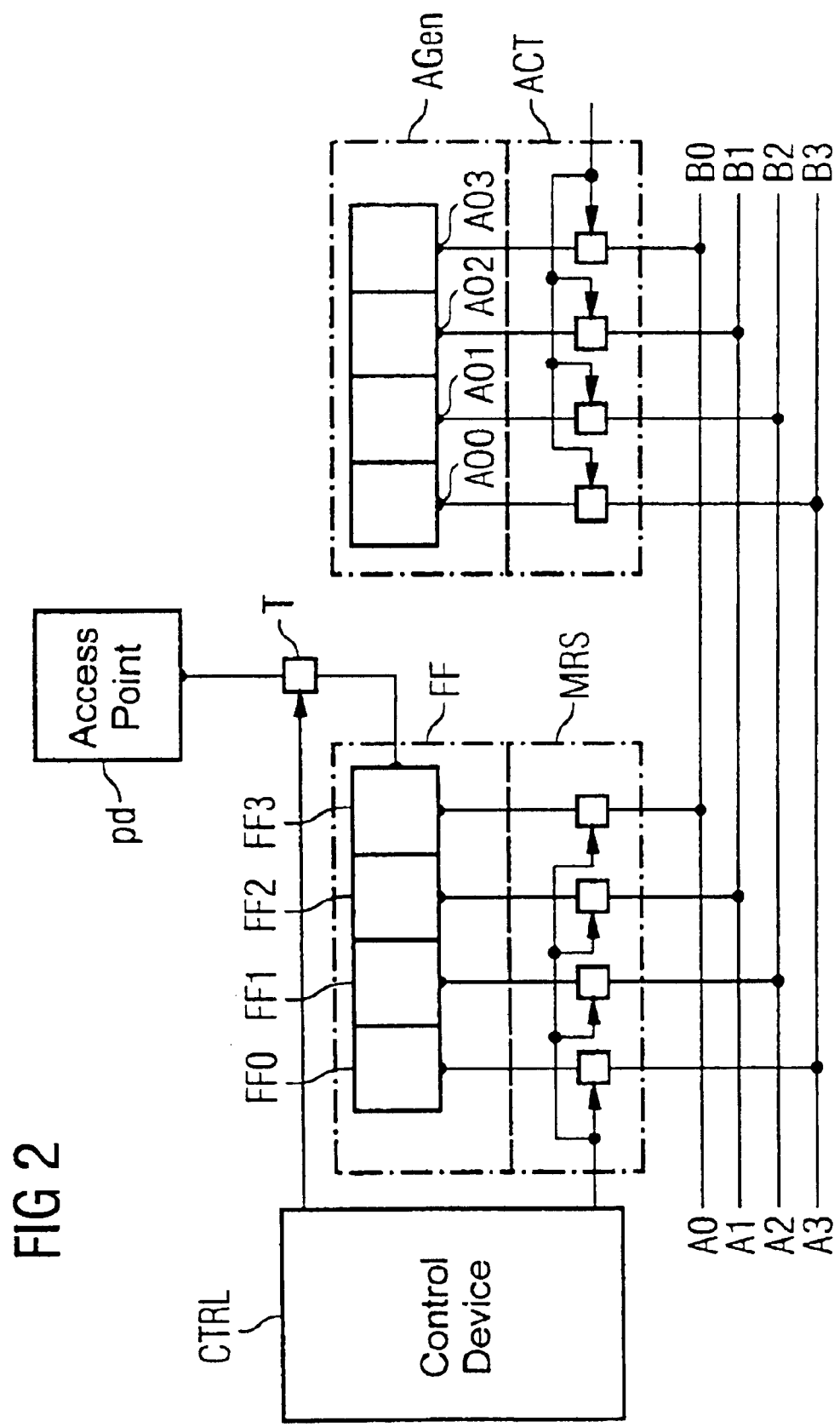
FIGS. 2 and 3 are block circuit diagrams showing embodiments of the semiconductor memory according to the invention.
Figure 3:
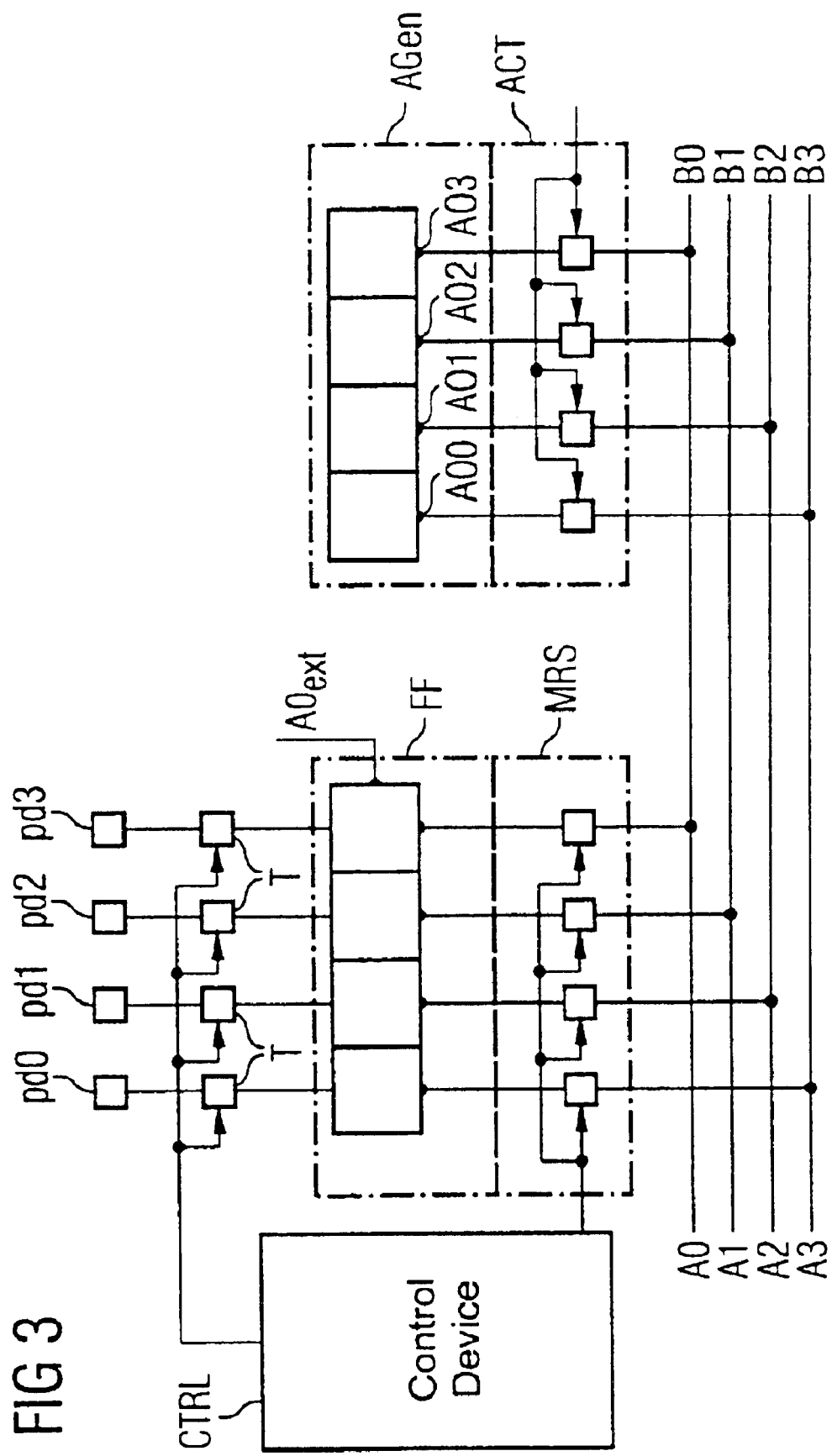

By contrast, the configurations shown in FIGS. 2 and 3 can be used to check and to establish the operation of the address generator AGen. The configuration shown in FIG. 2 contains all the elements that the (known) configuration shown in FIG. 1 also contains and which have already been presented in FIG. 1. However, the memory apparatus FF, which can be a shift register, in this case is in a form such that it can also store address values which are supplied to it (in parallel) from the address bus lines B0 to B3 through the second switching devices MRS. In addition, it is also in a form such that address values stored in it can be output serially to an access point pd in the integrated circuit via a third switching device T. In this case, the connecting line between the access point pd and the memory apparatus FF can be the same one as the line (see FIG. 1 in this regard) which can be used to supply the external address signal $A0_{ext}$ to the memory apparatus FF. In this case, the connecting line and the access point pd can be operated bi-directionally. However, the connecting line and the access point pd can also be independent of line and access for the external address signal $A0_{ext}$ (unidirectional operation).

During testing, a control device CTRL prompts the second switching devices MRS and the third switching device T to connect, so that the inventive method, which is carried out in a special test mode of the integrated circuit, proceeds in the following manner: the address generator AGen generates address signals and sends them via the address outputs A00 to A03 and the set of first switching devices ACT to the address bus lines B0 to B3 in the address bus A0 to A3. At a particular time, the address signals through the address bus lines B0 to B3 of the address bus A0 to A3 are transferred, under the control of the control device CTRL, though the set of second switching devices MRS to the memory elements FF0 to FF3 in the memory apparatus FF and are accepted and stored by the latter. Likewise under the control of the control device CTRL, the values stored in the memory apparatus FF are then output in succession via the third switching device T to the access point pd in the integrated circuit, so that they can be compared with the nominal values which are expected.

The embodiment shown in FIG. 3 differs from that shown in FIG. 2 only in that the memory elements FF0 to FF3 in the memory apparatus FF are in a form such that the stored values can be output in parallel through a set of third switching devices T to a set of access points pd0 to pd3 in the integrated circuit. The set of third switching devices T, like the individual third switching device T shown in FIG. 2, is also controlled by the control device CTRL. The stored values are thus output to the access points pd0 to pd3 in parallel in the embodiment shown in FIG. 3.

The great advantage of the present invention over the known configuration based on the prior art is that almost no additional elements are required. In the minimal case, only a single third switching device T is required. In addition, there are also slight modifications to the memory apparatus FF and to the control device CTRL, in order to allow parallel transfer of the address values from the address bus A0 to A3 to the memory apparatus FF. Any necessary enlargement of the chip area can turn out to be minimal, if not even to be dispensed with completely (namely if the third switching device T can be disposed such that it uses an already existing space which is actually not used for circuitry and lines).

We claim:

1. A configuration for checking an address generator of a test apparatus of an integrated circuit, comprising:

an address bus having lines;

a set of first switching devices connected to said lines and to the address generator, the address generator having a given number of address outputs connected by said set of first switching devices to said lines of said address bus for outputting first address values, generated in the address generator, onto said address bus;

a set of second switching devices connected to said lines;

at least one access point; and a memory apparatus with a plurality of memory elements equal to the given number of address outputs of the address generator and connected to said set of second switching devices, said memory apparatus receiving an external address signal for storing second address values, and the second address values stored in said memory apparatus being output from said memory elements of said memory apparatus onto said lines of said address bus through said set of second switching devices, said memory apparatus storing values of address signals present on said lines of said address bus, said memory apparatus connected to said access point and the values stored being output by said memory apparatus to said access point.

2. The configuration according to claim 1, further comprising a control device for controlling storage of the values of the address signals present on said lines of said address bus into said memory apparatus.

3. The configuration according to claim 1, further comprising at least one third switching device connected between said memory apparatus and said access point for outputting the values of the address signals stored in said memory apparatus to said access point.

4. The configuration according to claim 1, wherein the values stored in said memory apparatus are output serially to said access point.

5. The configuration according to claim 1, wherein said access point is one of a plurality of access points coupled to said memory apparatus, and the values stored in said memory apparatus are output in parallel to said access points.

* * * * *